(12) United States Patent
Gu et al.

(10) Patent No.: US 11,056,402 B2
(45) Date of Patent: Jul. 6, 2021

(54) INTEGRATED CIRCUIT CHIP AND MANUFACTURING METHOD THEREFOR, AND GATE DRIVE CIRCUIT

(71) Applicant: CSMC TECHNOLOGIES FAB2 CO., LTD., Jiangsu (CN)

(72) Inventors: Lihui Gu, Wuxi New District (CN); Sen Zhang, Wuxi New District (CN); Congming Qi, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/643,170

(22) PCT Filed: Aug. 31, 2018

(86) PCT No.: PCT/CN2018/103620
§ 371 (c)(1),
(2) Date: Feb. 28, 2020

(87) PCT Pub. No.: WO2019/042429
PCT Pub. Date: Mar. 7, 2019

(65) Prior Publication Data
US 2020/0258782 A1    Aug. 13, 2020

(30) Foreign Application Priority Data

Sep. 1, 2017 (CN) .......................... 201710779965.9

(51) Int. Cl.
*H01L 21/8234* (2006.01)
*H01L 29/76* (2006.01)
(Continued)

(52) U.S. Cl.
CPC .. *H01L 21/8249* (2013.01); *H01L 21/823418* (2013.01); *H01L 21/823493* (2013.01);
(Continued)

(58) Field of Classification Search
CPC ... H01L 21/8249; H01L 27/06; H01L 29/739; H01L 29/78; H01L 27/0623;
(Continued)

(56) References Cited

U.S. PATENT DOCUMENTS 10,002,961 B2 *  6/2018  Yamaji ................ H01L 27/0727
2003/0218186 A1 * 11/2003  Hano .................. H01L 27/0629
                                                                    257/197
(Continued)

FOREIGN PATENT DOCUMENTS

CN            104134661 A   * 11/2014

*Primary Examiner* — Shouxiang Hu
(74) *Attorney, Agent, or Firm* — Polsinelli PC (57) ABSTRACT

An integrated circuit chip and a manufacturing method therefor, and a gate drive circuit, the integrated circuit chip comprising: a semiconductor substrate (103), a high voltage island (101a) being formed in the semiconductor substrate (103); a high voltage junction terminal (102a), the high voltage junction terminal (102a) surrounding the high voltage island (101a), a depletion type MOS device (N1) being formed on the high voltage junction terminal (102a), a gate electrode and a drain electrode of the depletion type MOS device (N1) being short connected, and a source electrode of the depletion type MOS device (N1) being connected to a high side power supply end (VB) of the integrated circuit chip; and a bipolar transistor (Q1), a collector electrode of the bipolar transistor (Q1) being short connected to the substrate and being connected to a low side power supply end (VCC) of the integrated circuit chip, an emitter of the bipolar transistor (Q1) being connected to a gate electrode of the depletion type MOS device (N1).

15 Claims, 5 Drawing Sheets

(51) Int. Cl.
*H01L 21/8249* (2006.01)
*H01L 27/06* (2006.01)
*H01L 29/739* (2006.01)
*H01L 29/78* (2006.01)
*H01L 27/02* (2006.01)

(52) U.S. Cl.
CPC ...... *H01L 27/0255* (2013.01); *H01L 27/0259* (2013.01); *H01L 27/06* (2013.01); *H01L 29/739* (2013.01); *H01L 29/78* (2013.01); *H01L 29/7835* (2013.01)

(58) Field of Classification Search
CPC . H01L 29/7838; H01L 21/82; H01L 27/0255; H01L 27/0259; H01L 29/7835; H01L 27/0285; H01L 21/823493; H01L 21/823418
See application file for complete search history.

(56) References Cited

U.S. PATENT DOCUMENTS

2015/0021711 A1* 1/2015 Jonishi ................ H01L 27/0285
257/401
2017/0365595 A1* 12/2017 He ........................ H01L 29/872

* cited by examiner

FIG. 1A

PRIOR ART

PRIOR ART

PRIOR ART

INTEGRATED CIRCUIT CHIP AND MANUFACTURING METHOD THEREFOR, AND GATE DRIVE CIRCUIT

CROSS REFERENCE TO RELATED APPLICATIONS

This application is a National Phase of International Application No. PCT/CN2018/103620, filed on Aug. 31, 2018, which claims priority to Chinese Patent Application No. 201710779965.9, filed on Sep. 1, 2018, the contents of which are expressly incorporated by reference herein in their entireties.

TECHNICAL FIELD

The disclosure relates to semiconductor technologies, and in particular, to an integrated circuit chip and a method for manufacturing the same, and a gate driving circuit.

BACKGROUND

Figure 1A:
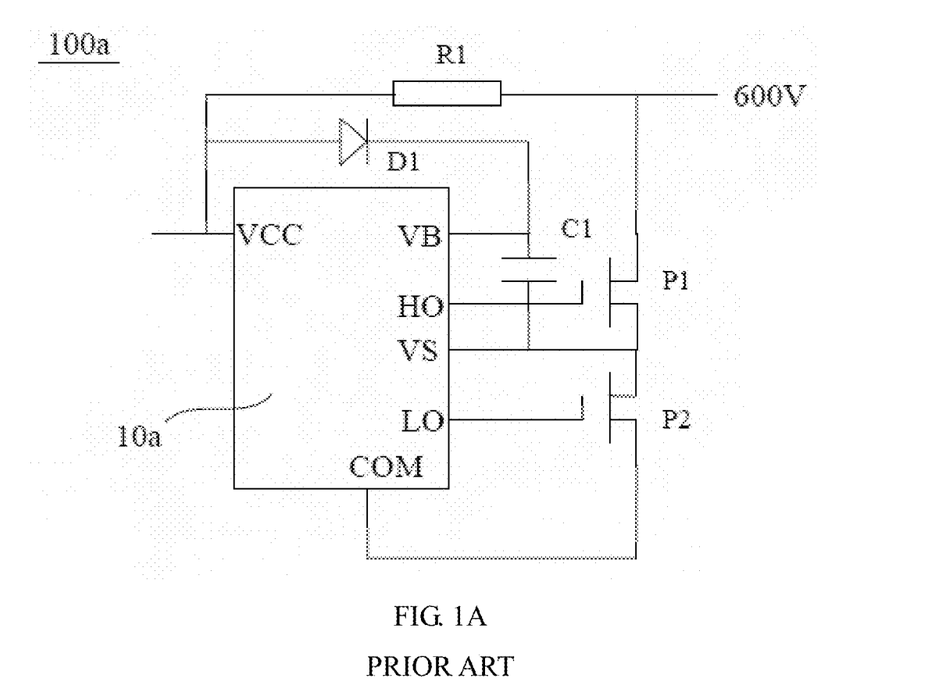
FIG. 1A shows a schematic diagram of a gate driving circuit in a conventional technology.

FIG. 1A shows a gate driving circuit 100a formed by a high voltage integrated circuit chip (HVIC) including a high voltage integrated circuit chip 10a, a resistor R1, a bootstrap diode D1, a bootstrap capacitor C1, a first power transistor P1, and a second power transistor P2. The high voltage integrated circuit chip 10a has low-side power source terminal VCC, high-side power source terminal VB, floating power source terminal VS, high-side output HO, low-side output LO, and ground terminal COM. The devices are connected as shown in FIG. 1A. The voltage of VS fluctuates periodically between the low voltage and the high voltage during the circuit operation. When the floating power source terminal VS is low level, the low-side power source terminal VCC can charge the bootstrap capacitor C1 through the bootstrap diode D1 to make the potential close to the VCC and supply power to the high-side power source VB. When the voltage at the VS terminal floats to the high voltage, the charge stored by the bootstrap capacitor exceeds the voltage of VCC, and the diode enters the reverse cut-off state. At this time, the voltage difference between VB and VS at both ends of bootstrap capacitor C1 is still about equal to VCC, thus supplying power to the high side control circuit. Therefore, the bootstrap diodes need to withstand high voltage and are usually realized by external discrete devices.

The conventional high voltage integrated circuit takes the external way to realize voltage bootstrap to supply power to the high side circuit, which adds complexity and difficulty and cost to the design of the application system circuit. The integrated process platform is often difficult to provide integrated suitable bootstrap diodes, so the integrated standard devices cannot be used as bootstrap diodes for HVICs.

SUMMARY

Accordingly, it is necessary to provide an integrated circuit chip and a method for manufacturing the same, and a gate driving circuit.

An integrated circuit chip, including:
a semiconductor substrate, in which a high-voltage island for manufacturing a high-voltage gate driving circuit is formed;
a high-voltage junction terminal surrounding the high voltage island, the high-voltage junction terminal including a depletion mode MOS, a gate and a drain of the depletion mode MOS are short-circuited, and a source of the depletion mode MOS is connected to a high-side power source terminal of the integrated circuit chip; and
a bipolar transistor, a collector, and a base of the bipolar transistor are short-circuited, the collector of the bipolar transistor is connected to a power source terminal, and an emitter of the bipolar transistor is connected to the gate of the depletion mode MOS.

The details of one or more embodiments of the application are set forth in the accompanying drawings and the description below. Other features and advantages of the application will be apparent from the description, drawings, and claims.

For another aspect, a method for manufacturing an integrated circuit chip is also provided, including:
providing a semiconductor substrate, and forming a high-voltage island for manufacturing a high-voltage gate driving circuit in the semiconductor substrate;
forming a high-voltage junction terminal in the semiconductor substrate, the high-voltage junction terminal surrounds the high voltage island, the high-voltage junction terminal includes a depletion mode MOS formed, a gate and a drain of the depletion mode MOS are short-circuited, and a source of the depletion mode MOS is connected to a high-side power source terminal of the integrated circuit chip; and
forming a bipolar transistor in the semiconductor substrate, a collector and a base of the bipolar transistor are short-circuited, the collector of the bipolar transistor is connected to the low-side power source terminal of the integrated circuit chip, and an emitter of the bipolar transistor is connected to a gate of the depletion MOS device.

A further aspect also provides a gate driving circuit, including an integrated circuit chip described above, and a resistor, a bootstrap capacitor, a first power transistor, and a second power transistor, a power source terminal of the integrated circuit chip is connected to a working power source through the resistor, a first terminal of the bootstrap capacitor is connected to a high-side power source terminal of the integrated circuit chip, a second terminal of the bootstrap capacitor is connected to a floating power source terminal of the integrated circuit chip, a gate of the first power transistor is connected to a high-terminal output of the integrated circuit chip, a source of the first power transistor is connected to the working power source, a drain of the first power transistor is connected to the floating power source terminal of the integrated circuit chip and a drain of the second power transistor, a gate of the second power transistor is connected to a low-side output terminal of the integrated circuit chip, and a source of the second power transistor is connected to a ground terminal of the integrated circuit chip.

BRIEF DESCRIPTION OF THE DRAWINGS

To illustrate the technical solutions according to the embodiments of the disclosure more clearly, the accompanying drawings for describing the embodiments or the prior art are introduced briefly in the following. Apparently, the accompanying drawings in the following description are only some embodiments of the disclosure, and persons of ordinary skill in the art can derive other drawings from the accompanying drawings without creative efforts.

In the accompanying drawings.

DETAILED DESCRIPTION OF THE EMBODIMENTS

In the following description, lots of specific details are given in order to provide a more thorough understanding of the disclosure. It is obvious to those skilled in the art, however, that the disclosure can be implemented without the need for one or more of these details. In other examples, in order to avoid confusion with the disclosure, some of the technical features well known in the art are not described.

It should be understood that the disclosure can be implemented in different forms and should not be construed as limiting to the embodiments proposed herein. On the contrary, providing these embodiments will make the disclosure thorough and complete, and the scope of the disclosure fully communicated to those skilled in the art. In the drawings, for clarity, the dimensions of layers and regions and relative dimensions may be exaggerated. The same reference numerals represent the same elements from beginning to terminal.

It should be understood that when elements or layers are referred to as "on", "adjacent to", "connected to", or "coupled to" other elements or layers, it may be directly on, adjacent to, connected to, or coupled to other elements or layers, or intermediary elements or layers may present. On the contrary, when the element is called "directly on", "directly adjacent to", "directly connected to" or "directly coupled to" other elements or layers, there is no intermediate element or layer. It should be understood that, although the terms First, Second, and Third may be used to describe elements, components, areas, layers and/or parts, those elements, components, areas, layers and/or parts should not be limited by those terms. These terms are used only to distinguish one element, part, area, layer or part from another. Thus, without departing from the teachings of the disclosure, the first element, component, zone, layer or part discussed below may be represented as a second element, component, zone, layer or part.

Space relationship terms such as "under", "below", "lower", "beneath", "on", "upper", etc., can be used here for convenience of description to describe the relationship between an element or feature shown in the drawing and other elements or features. It should be understood that, other than the orientations shown in the figures, the spatial relational terminology includes different orientations of the devices in use and operation. For example, if the device in the drawing is reversed, then elements or features described as "under other elements", or "below", or "beneath" will be oriented to "above" other elements or features. Thus, the exemplary term "under" and "below" may include both upper and lower orientations. The device may be otherwise oriented (rotated by 90 degrees or other orientations) and the spatial descriptors used herein are interpreted accordingly.

The terminology used herein is intended only to describe specific embodiments and is not a limitation of the disclosure. In this case, the singular forms "one", "one" and "the/said" are also intended to include plural forms unless the context clearly indicates otherwise. The term "composition" and/or "including" shall also be understood and, when used in the specification, the presence of the features, integers, steps, operations, elements and/or components described, without rule out the presence or addition of one or more other features, integers, steps, operations, elements, components and/or components. When used herein, the term "and/or" includes any and all combinations of the items listed.

In order to have a thorough understanding of the disclosure, detailed structures and steps will be proposed in the following description in order to illustrate the technical solutions proposed by the disclosure. The preferred embodiments of the disclosure are described in detail below, but other than these detailed descriptions, the disclosure may have other embodiments.

Embodiment I

To overcome the foregoing problems, the embodiment provides an integrated circuit chip and a gate driving circuit formed by using the integrated circuit chip. The integrated circuit chip is formed with a bootstrap device and therefore does not need to use an external bootstrap diode, thus overcoming the problems of design complexity, debugging difficulties, and high cost caused by avoiding the use of the external bootstrap diode. The object of this embodiment is realized by designing a high-voltage-resistant depletion mode NMOS device, which is integrated with a high-voltage island of a high-voltage integrated circuit, so that a layout area of the chip can be substantially not increased, and a circuit structure in which the device can be used is provided.

The following describes an integrated circuit chip according to an embodiment of the disclosure and a bootstrap circuit formed by using the integrated circuit chip with reference to FIGS. 1B to 3B.

Figure 1B:
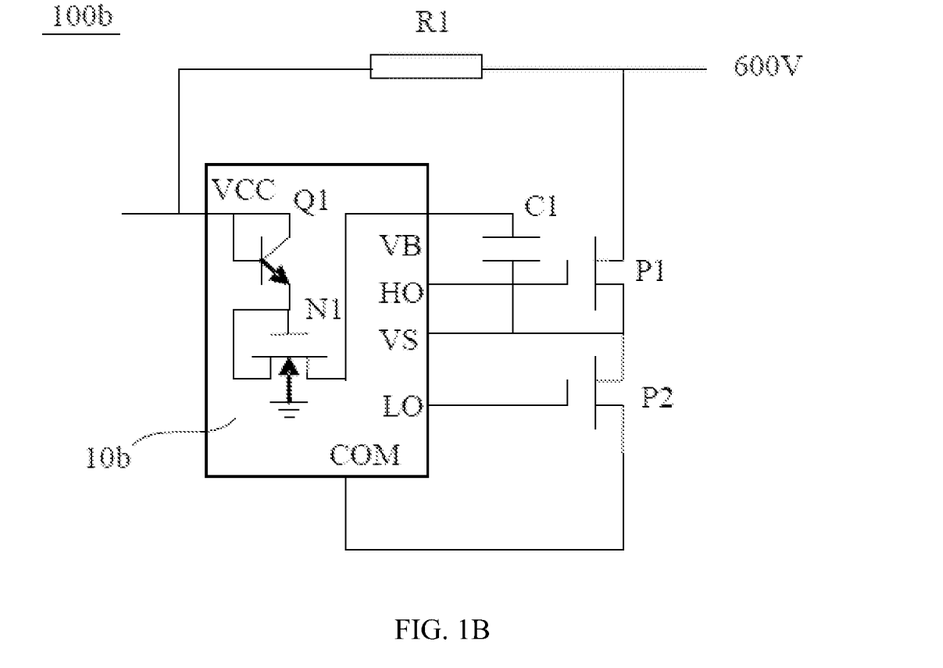
FIG. 1B shows a schematic diagram of a gate driving circuit according to an embodiment of the disclosure.

First, as shown in FIG. 1B, the embodiment discloses a bootstrap circuit 100b in which a bipolar transistor Q1 and a high voltage withstanding depletion mode NMOS device N1 are formed.

The connection relationship of the gate driving circuit shown in FIG. 1B is as follows: the collector and base of the bipolar transistor Q1 are short-circuited and connected to the low-side power source terminal VCC of the integrated circuit chip 10b, the emitter of the bipolar transistor Q1 is connected to the gate of the depletion mode MOS N1, the gate and drain of the depletion mode MOS N1 are short-circuited, and the source of the depletion mode MOS is connected to the high-side power source terminal VB of the integrated circuit chip 10b. The low-side output terminal VCC of the integrated circuit chip 10b is connected to a working power source (for example, an external working power source at a voltage of 600 V) through a resistor R1, the high-side power source terminal VB of the integrated circuit chip 10b is connected to a first terminal of the bootstrap capacitor C1, the floating power source terminal VS of the integrated circuit chip 10b is connected to a second terminal of the bootstrap capacitor C1, the high-terminal output HO of the integrated circuit chip 10b is connected to a gate of the first power transistor P1, the source electrode of the first power transistor P1 is connected to the working power source, the drain electrode of the first power transistor P1 is connected to the floating power source terminal VS of the integrated circuit chip 10b and the drain electrode of the second power transistor P2, the low-terminal output LO of the integrated circuit chip 10b is connected to a gate electrode of the second power transistor P2, and the source of the second power transistor P2 is connected to the ground terminal COM of the integrated circuit chip 10b.

The principle of realizing the bootstrap of the gate driving circuit 100b shown in FIG. 1B is that the level of the VS terminal of the integrated circuit chip 10b periodically floats between the low level and the high level during operation. When the VS terminal is at the low level, the bipolar transistor Q1 is in the positive switched-on state and the depleted high voltage NMOS device N1 is in the turned-on state, so that the operating power source charges the bootstrap capacitor C1 connected between the VB and VS ends. When the VS terminal floats to the high voltage, the voltage of the VB terminal increases synchronously under the action of the bootstrap capacitor C1. When the potential of the VS terminal exceeds the VCC terminal, the bipolar transistor Q1 enters the reverse cut-off state. After the voltage of the VS terminal rises further, the depleted high voltage NMOS device N1 turns into the cut-off state due to the offset action. In this way, the device provided by the disclosure (that is, the integrated circuit chip 10b) can constitute the gate driving circuit of FIG. 1B, thereby eliminating the external separate bootstrap diode.

It should be understood that the integrated circuit chip 10b typically includes a control circuit, a low-side driving circuit, a high-side driving circuit, and a level shift circuit that transmits a low-side control signal of the control circuit to the high-side driving circuit. The high-side driving circuit is formed in the high-voltage island of the chip or semiconductor substrate, and the potential is floating potential. The high-side driving circuit is usually surrounded by the high-voltage junction terminal to withstand the high voltage, and functions to isolate the high-side driving circuit from the low-side driving circuit. In this embodiment, the bipolar transistor Q1 of the high-voltage integrated circuit chip 10b is fabricated in the low-voltage region of the integrated circuit chip, and the high-voltage junction terminal of the high-voltage island of the integrated circuit chip is simultaneously used as the high-voltage NMOS device N1, so that the layout area is hardly increased.

The bipolar transistor Q1 can be realized by standard bipolar transistor of BCD process platform, which is omitted for brevity. The following describes the high-voltage island and the high-voltage junction terminal of the integrated circuit chip 10b of this embodiment with reference to FIGS. 2A to 3B, and describes the differences between the high-voltage island and the high-voltage junction terminal of the current high-voltage integrated circuit chip 10a.

Figure 2A:
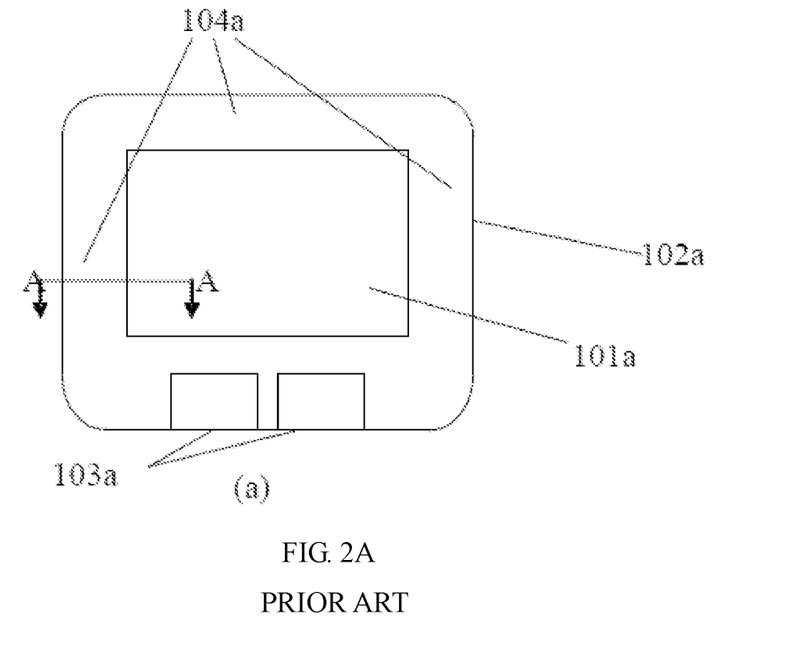
FIG. 2A schematically shows a top view of a high voltage island and high-voltage junction terminal of an integrated circuit chip in a conventional technology.
Figure 2B:
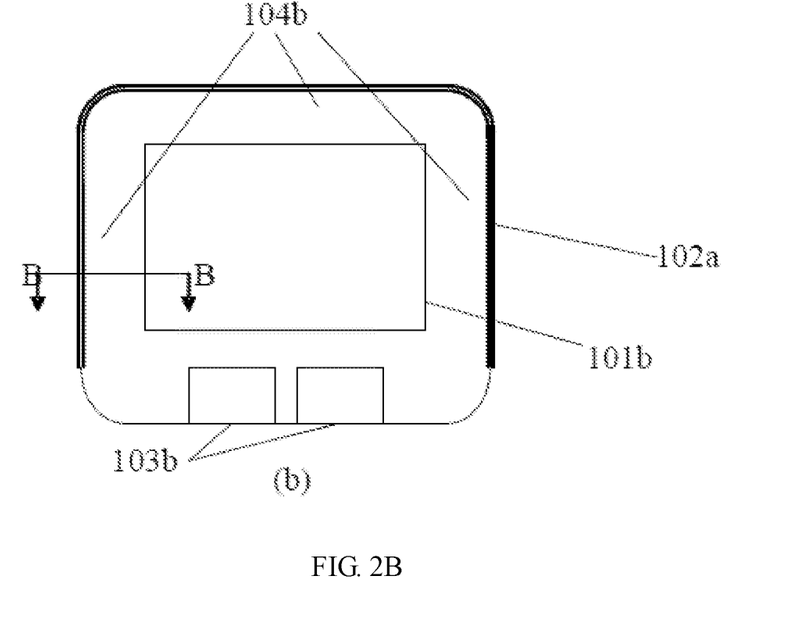
FIG. 2B schematically shows a top view of a high-voltage island and high-voltage junction terminal according to an embodiment of the disclosure.

Referring first to FIGS. 2A and 2B, FIG. 2A is a schematic top view of a conventional high-voltage island and high-voltage junction terminal, and FIG. 2B is a schematic top view of a high-voltage island and high-voltage junction terminal according to this embodiment. The conventional high-voltage island 101A shown in FIG. 2A (exemplarily a quadrilateral) is surrounded by a high-voltage junction terminal 102a (exemplarily a quadrilateral), usually on one side of the high-voltage junction terminal 102a, for example, 103a in FIG. 2A integrates two level shift devices, such as LDMOS devices, and on the other three sides of the high-voltage junction terminal 102a, for example, 104a in FIG. 2A, for a conventional high-voltage junction terminal, ensuring high-voltage island withstanding voltage. FIG. 2B shows the high-voltage island 101b proposed in this embodiment. The high-voltage island 101b integrates a depletion high-voltage NMOS device on the three sides 104b of the high-voltage junction terminal 102b, and also integrates two high-level shift devices 103b on the other side of the high-voltage junction terminal. As can be seen from FIG. 2B, this embodiment utilizes a three-side high-voltage junction terminal without a device on a conventional high-voltage island, and no extra area is needed.

Figure 3A:
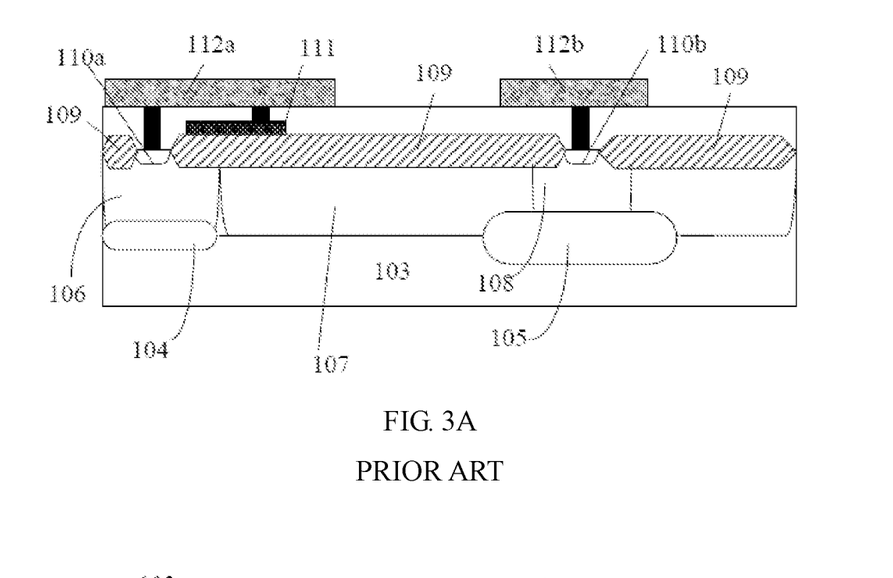
FIG. 3A is a cross-sectional view of the high-voltage junction terminal of the integrated circuit chip shown in FIG. 2A along a A-A direction.
Figure 3B:
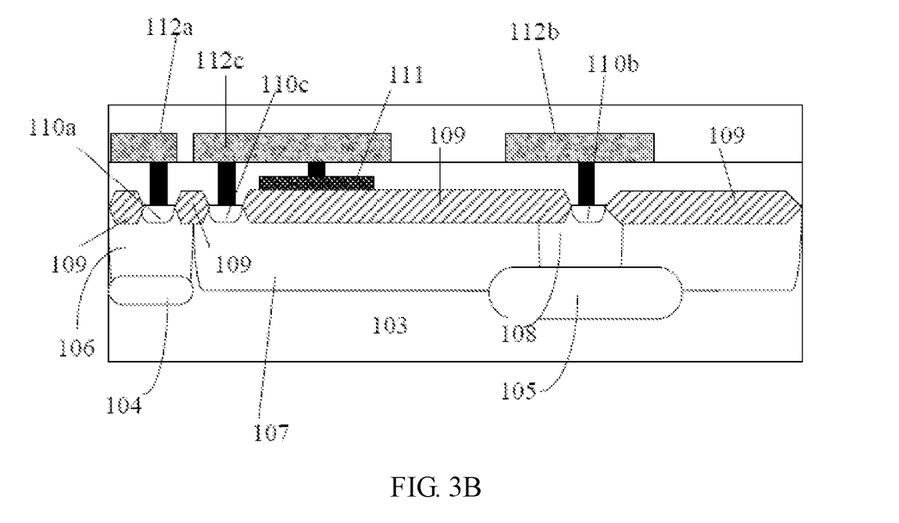
FIG. 3B is a cross-sectional view of the high-voltage junction terminal of the integrated circuit chip shown in FIG. 2B along a B-B direction.

Then, as shown in FIGS. 3A and 3B, FIG. 3A is a schematic diagram of a conventional high-voltage junction terminal, corresponding to the cross-sectional position A-A of FIG. 2A, its basic structure includes a p-type substrate 103, a P-type buried layer 104, and a deep N buried layer 105 located in the P-type substrate 103, and an epitaxial post-fabricated P-well 106 and a high-voltage N-well 107 located above the P-type buried layer 104 and deep N buried layer 105. The high-voltage N-well 107 is used as a drift region, in which a low-voltage N-well 108 is formed, the P+ active region 110a is formed in the P-well 106 to lead out P-well and connect to the P-substrate, a N+ active region 110b is formed in the low-voltage N-well 108 to lead out N-well, that is, an isolation structure 109 such as a field oxide layer is formed between the high-voltage island potential VB terminal, P+ active region 11a, and N+ active region 110b, between the high-voltage island potential VB terminal, P+ active region 11a, and N+ active region 110b, and between other adjacent regions (not shown), and a polysilicon field plate 111 is formed on the isolation structure 109 between the P+ active region 110a and N+ active region 110b. 112a is a metal lead-out leading out the P+ active region and, simultaneously, leading out the polysilicon field plate 111, and 112b is a metal lead-out connected to the N+ active region and leading out the high voltage island potential (i.e., the high side power source terminal VB). A dielectric layer and a through-hole filled with conductive material are formed between the metal lead-out and the substrate to connect the metal lead-out and the corresponding region.

FIG. 3B is a structure of a high-voltage depletion mode NMOS device disclosed in this embodiment corresponding to the cross-sectional position B-B of FIG. 2B, the basic structure of which includes a P-type substrate 103 in which a P type buried layer 104 and a deep N buried layer 105 are formed. A P-well 106 and a high voltage N-well 107 are formed on the P type buried layer 104 and the deep N buried layer 105. High voltage N-well 107 is used as drift region, and low voltage N-well 108 is formed in the high voltage N-well 107. The P+ active region 110a is formed in the P-well 106 to lead out the P-well and connect to the P substrate. The N+ source region 110b is formed in the low-voltage N-well 108 to lead out the N-well. The N+ drain 110c is also formed in the high-voltage N-well to lead out the high-voltage N-well to form the drain of the depleted NMOS device. An isolation structure 109 such as a field oxide layer is formed between the P+ active region 110a, the N+ source region 110b, and the N+ drain region 110c, and between other neighboring regions (not shown). The polysilicon field plate 111 is formed on the isolation structure 109 between the N+ drain 110c and the N+ source 110b. The metallic lead-out 112a is electrically connected to the P+ active region through the through-hole, and the metallic lead-out 112b is electrically connected to the N+ source region 110b, which is used to electrically connect to the high-side power source VB. The metal lead-out 112c is the metal lead-out of the drain and gate of the high-voltage depleted NMOS device. The short-circuiting of the drain and gate increases the charging current.

It can be seen from the comparison between FIG. 3A and FIG. 3B that the high-voltage-resisting depletion mode NMOS device N1 of this embodiment only increases the injection of the drain and changes the connection mode of some metal lead-outs, which can be completely fabricated by using the existing level of the standard process platform without additional costs.

It should be noted that for the high-voltage junction terminal 104*b* in FIG. 2B, its cross-section is the structure shown in FIG. 3B, that is, for a high-voltage island, a depletion mode MOS is formed on the high-voltage junction terminal whose width is the sum of the three sides 104*b* of the high-voltage junction terminal.

According to the integrated circuit chip and the bootstrap circuit of this embodiment, since a depletion mode MOS is formed at the high-voltage junction terminal inside the chip, it can withstand a high voltage and can be used as the bootstrap device. This makes it unnecessary to use external bootstrap diode to form bootstrap circuit, improves the integration of chip, simplifies peripheral circuit, reduces cost and improves reliability. And the integrated bootstrap device does not require additional process and is compatible with the standard process.

Embodiment II

Figure 4:
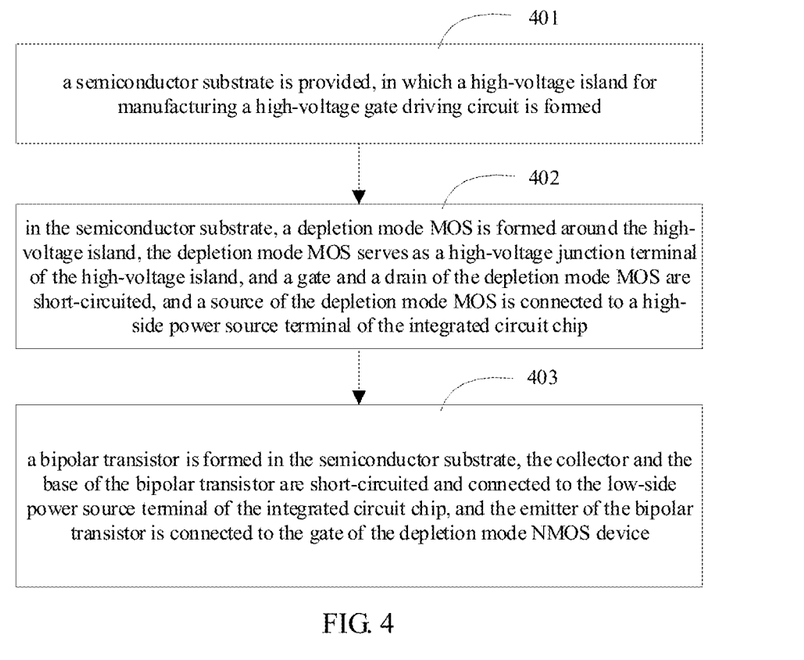
FIG. 4 shows a flowchart of a method for manufacturing an integrated circuit chip according to an embodiment of the disclosure.

This embodiment proposes a method for manufacturing an integrated circuit chip, as shown in FIG. 4, including:

At step 401, a semiconductor substrate is provided, in which a high-voltage island for manufacturing a high-voltage gate driving circuit is formed.

The semiconductor substrate may be at least one of the following materials mentioned: Si, Ge, SiGe, SiC, SiGeC, InAs, GaAs, InP or other III/V compound semiconductors, and further includes multilayer structures formed by these semiconductors or may be silicon on insulators (SOI), stacked silicon on insulators (SSOI), stacked silicon on insulators (S-SiGeOI), germanium on insulators (SiGeOI), and germanium on insulators (GeOI). Devices such as NMOS and/or PMOS may be formed on the semiconductor substrate. Similarly, a conductive member may be formed in the semiconductor substrate, and the conductive member may be a gate, a source, or a drain of a transistor, or may be a metal interconnection structure electrically connected to the transistor, or the like.

The high-voltage island and high-voltage gate driving circuits described may be fabricated according to specific circuit layout and design by methods commonly used in the art such as photolithography, injection, and etching, which are not described herein.

At step 402, in the semiconductor substrate, a depletion mode MOS is formed around the high-voltage island, the depletion mode MOS serves as a high-voltage junction terminal of the high-voltage island, and a gate and a drain of the depletion mode MOS are short-circuited, and a source of the depletion mode MOS is connected to a high-side power source terminal of the integrated circuit chip.

In an embodiment, the high-voltage junction terminal/depletion mode MOS and the layout of the high voltage island are shown in FIG. 2B, and the high voltage island and the high-voltage junction terminal are quadrilateral, forming the depletion mode MOS on three consecutive sides of the high voltage island. For example, a high-level shift device, such as an LDMOS device, is formed on the remaining side of the high voltage island.

In an embodiment, the depletion mode MOS may be completed by the following steps:

First, forming an adjacent first well region of a first conductivity type and a second well region of a second conductivity type on the semiconductor substrate, the first conductivity type such as P type and the second conductivity type such as N type;

Next, a first buried layer of the first conductivity type and a second buried layer of the second conductivity type are formed on the semiconductor substrate;

Then, an epitaxial layer is formed on the semiconductor substrate, a first well region of the first conductivity type and a second high-voltage well region of the second conductivity type are fabricated in the epitaxial layer, and a third low-voltage well region of the second conductivity type is fabricated in the second high-voltage well region;

Then, an isolation structure such as field oxygen is formed in the epitaxial layer to define an active region;

Then, an active region of the first conductivity type is formed in the first well region, a drain of the second conductivity type is formed in the second well region, and a source region of the second conductivity type is formed in the third well region;

A polysilicon field plate is then formed on the isolation structure between the drain of the second conductivity type and the source region of the second conductivity type;

Next, a first dielectric layer covering the active region of the first conductivity type, the drain of the second conductivity type, the source region of the second conductivity type, and the polysilicon field plate is formed;

Then, contact holes filled with conductive material are formed in the first dielectric layer;

Then, metal lead-outs are formed through the contact hole to the active region of the first conductivity type, the drain of the second conductivity type, the source region of the second conductivity type, and the polysilicon field plate; the drain of the second conductivity type and the polysilicon field plate are connected to the same metal lead-out.

At step 403, a bipolar transistor is formed in the semiconductor substrate, the collector and the base of the bipolar transistor are short-circuited and connected to the low-side power source terminal of the integrated circuit chip, and the emitter of the bipolar transistor is connected to the gate of the depletion mode NMOS device.

It should be understood that the bipolar transistor is formed in an area in the semiconductor substrate that is outside the high-voltage junction terminal.

Thus, the process steps of the method for manufacturing an integrated circuit chip according to the embodiments of the disclosure are completed. It may be understood that the methods for manufacturing an integrated circuit chip in the embodiments includes not only the foregoing steps, but also other required steps such as the steps of making a bipolar transistor and a low-voltage driving circuit and a control circuit.

It should be understood that the foregoing steps describe only the steps included in the manufacturing of the integrated circuit chip according to the embodiments of the disclosure, and do not mean the sequence of the steps, and the steps mentioned therein may be carried out in sequence or simultaneously.

According to the manufacturing method of the integrated circuit chip of this embodiment, since a depletion mode MOS can be formed at a high-voltage junction terminal inside the chip, it can be used as a bootstrap device, so that an external bootstrap diode is not needed to form the bootstrap circuit, the integration of the chip is improved, the peripheral circuit is simplified, the cost is reduced, the reliability is improved, and the integrated bootstrap device does not need an extra process, which is compatible with the standard process.

The disclosure has been described by the foregoing embodiments, but it should be understood that the foregoing embodiments are intended only for the purposes of illustration and description and are not intended to limit the disclosure to the scope of the described embodiments. In addition, a person skilled in the art may understand that the disclosure is not limited to the foregoing embodiments, and further variations and modifications may be made according to the teachings of the disclosure, which are within the scope of the protection claimed by the disclosure. The scope of protection of the disclosure is defined by the appended claims and their equivalents.

What is claimed is:

1. An integrated circuit chip, comprising:
    a semiconductor substrate, in which a high-voltage island for manufacturing a high-voltage gate driving circuit is formed;
    a high-voltage junction terminal surrounding the high-voltage island, the high-voltage junction terminal including a depletion mode MOS formed around the high voltage island, a gate and a drain of the depletion mode MOS being short-circuited, and a source of the depletion mode MOS being connected to a high-side power source terminal; and
    a bipolar transistor, a collector and a base of the bipolar transistor being short-circuited, the collector of the bipolar transistor being connected to a low-side power source terminal, and an emitter of the bipolar transistor being connected to the gate of the depletion mode MOS.

2. The integrated circuit chip according to claim 1, wherein the high-voltage island is tetragonal and the depletion mode MOS is formed on three adjacent sides of the high-voltage island.

3. The integrated circuit chip according to claim 2, wherein a high-level shift device is formed on a fourth side of the high voltage island other than the three sides.

4. The integrated circuit chip according to claim 1, wherein the depletion mode MOS comprises:
    a first well region of a first conductivity type and a second well region of a second conductivity type which are formed on the semiconductor substrate and adjacent to each other;
    an active region of the first conductivity type formed in the first well region;
    a drain and a third well region which are of the second conductivity type formed in the second well region;
    a source of the second conductivity type formed in the third well region;
    an isolation structure formed in the semiconductor substrate and located in between the active region of the first conductivity type, the drain of the second conductivity type, and the source of the second conductivity type; and
    a polysilicon field plate formed on the isolation structure between the drain of the second conductivity type and the source of the second conductivity type.

5. The integrated circuit chip according to claim 4, wherein the depletion mode MOS further comprises:
    a first buried layer of the first conductivity type formed between the first well region and the semiconductor substrate; and
    a second buried layer of the second conductivity type formed between the third well region and the semiconductor substrate.

6. The integrated circuit chip according to claim 4, wherein the depletion mode MOS further comprises:
    a first dielectric layer covering the active region of the first conductivity type, the drain of the second conductivity type, the source of the second conductivity type, and the polysilicon field plate;
    a contact hole formed in the first dielectric layer filled with a conductive material; and
    metal lead-outs connected to the active region of the first conductivity type, the drain of the second conductivity type, the source region of the second conductivity type, and the polysilicon field plate through the contact hole;
    wherein the drain of the second conductivity type and the polysilicon field plate are connected to the same metal lead-out.

7. The integrated circuit chip according to claim 1, wherein the bipolar transistor is formed in an area of the semiconductor substrate located outside the high-voltage junction terminal.

8. A gate driving circuit, comprising an integrated circuit chip according to claim 1, and a resistor, a bootstrap capacitor, a first power transistor, and a second power transistor, wherein a low-side power source terminal of the integrated circuit chip is connected to a working power source through the resistor, a first terminal of the bootstrap capacitor is connected to a high-side power source terminal of the integrated circuit chip, a second terminal of the bootstrap capacitor is connected to a floating power source terminal of the integrated circuit chip, a gate of the first power transistor is connected to a high-terminal output of the integrated circuit chip, a source of the first power transistor is connected to the working power source, a drain of the first power transistor is connected to the floating power source terminal of the integrated circuit chip and a drain of the second power transistor, a gate of the second power transistor is connected to a low-side output terminal of the integrated circuit chip, and a source of the second power transistor is connected to a ground terminal of the integrated circuit chip.

9. A method for manufacturing an integrated circuit chip, comprising:
    providing a semiconductor substrate, and forming a high-voltage island for manufacturing a high-voltage gate driving circuit in the semiconductor substrate;
    forming a high-voltage junction terminal in the semiconductor substrate, wherein the high-voltage junction terminal surrounds the high voltage island, the high-voltage junction terminal includes a depletion mode MOS formed around the high voltage island, a gate and a drain of the depletion mode MOS are short-circuited, and a source of the depletion mode MOS is connected to a high-side power source terminal of the integrated circuit chip; and
    forming a bipolar transistor in the semiconductor substrate, wherein a collector and a base of the bipolar transistor are short-circuited, the collector of the bipolar transistor is connected to a low-side power source terminal of the integrated circuit chip, and an emitter of the bipolar transistor is connected to the gate of the depletion mode MOS device.

10. The method according to claim 9, wherein the high-voltage island is tetragonal and the depletion mode MOS is formed on three adjacent sides of the high-voltage island.

11. The method according to claim 10, further comprising:
   forming a high-level shift device on a fourth side of the high-voltage island other than the three sides.

12. The method according to claim 9, wherein the step of forming the depletion mode MOS comprises:
   forming a first well region of a first conductivity type and a second well region of a second conductivity type on the semiconductor substrate adjacent to each other;
   forming an active region of the first conductivity type in the first well region;
   forming a drain and a third well region of the second conductivity type in the second well region;
   forming a source region of the second conductivity type in the third well region;
   forming an isolation structure between the active region of the first conductivity type, the drain of the second conductivity type, and the source region of the second conductivity type; and
   forming a polysilicon field plate on the isolation structure between the drain of the second conductivity type and the source region of the second conductivity type.

13. The method according to claim 12, wherein the step of forming the depletion mode MOS in the high-voltage junction terminal further comprises:
   forming a first buried layer of the first conductivity type between the first well region and the semiconductor substrate; and
   forming a second buried layer of the second conductivity type between the third well region and the semiconductor substrate.

14. The method according to claim 12, wherein the step of forming the depletion mode MOS further comprises:
   forming a first dielectric layer covering the active region of the first conductivity type, the drain of the second conductivity type, the source region of the second conductivity type, and the polysilicon field plate;
   forming a contact hole filled with a conductive material in the first dielectric layer; and
   forming metal lead-outs connected to the active region of the first conductivity type, the drain of the second conductivity type, the source region of the second conductivity type, and the polysilicon field plate through the contact hole, wherein the drain of the second conductivity type and the polysilicon field plate are connected to the same metal lead-out.

15. The method according to claim 9, wherein the bipolar transistor is formed in a region in the semiconductor substrate located outside the high-voltage junction terminal.

\* \* \* \* \*